United States Patent
Kang

(10) Patent No.: US 7,781,864 B2
(45) Date of Patent: Aug. 24, 2010

(54) CAPACITOR OF SEMICONDUCTOR DEVICE AND METHOD FOR MANUFACTURING THE SAME

(75) Inventor: Myung-Il Kang, Yongin-si (KR)

(73) Assignee: Dongbu HiTek Co., Ltd., Seoul (KR)

( * ) Notice: Subject to any disclaimer, the term of this patent is extended or adjusted under 35 U.S.C. 154(b) by 79 days.

(21) Appl. No.: 12/330,614

(22) Filed: Dec. 9, 2008

(65) Prior Publication Data

US 2009/0152678 A1   Jun. 18, 2009

(30) Foreign Application Priority Data

Dec. 17, 2007   (KR) .................... 10-2007-0131943

(51) Int. Cl.
*H01L 27/08* (2006.01)
*H01L 27/10* (2006.01)

(52) U.S. Cl. ............... 257/532; 257/758; 257/E27.048; 257/E27.071; 438/329

(58) Field of Classification Search ................. 257/532, 257/758, E27.048, E27.071; 438/329
See application file for complete search history.

(56) References Cited

U.S. PATENT DOCUMENTS

| | | | | |
|---|---|---|---|---|
| 2003/0011043 A1* | 1/2003 | Roberts | ....................... | 257/532 |
| 2005/0139887 A1* | 6/2005 | Song | .......................... | 257/296 |
| 2005/0285226 A1* | 12/2005 | Lee | .............................. | 257/535 |
| 2007/0262417 A1* | 11/2007 | Ohtake et al. | ................ | 257/532 |
| 2008/0001292 A1* | 1/2008 | Zelner et al. | ................. | 257/758 |
| 2008/0277705 A1* | 11/2008 | Takahashi et al. | ............ | 257/295 |
| 2009/0087958 A1* | 4/2009 | Uchiyama | .................... | 438/387 |
| 2009/0121316 A1* | 5/2009 | Zelner et al. | ................. | 257/532 |
| 2009/0302363 A1* | 12/2009 | Nagai | .......................... | 257/295 |

* cited by examiner

*Primary Examiner*—Victor A Mandala
(74) *Attorney, Agent, or Firm*—Sherr & Vauhgn, PLLC

(57) ABSTRACT

A capacitor includes a first lower metal layer and an insulating layer on a lower interlayer dielectric layer of a semiconductor substrate; a first upper metal layer aligned on the insulating layer to partially expose it; a first capping layer and an upper interlayer dielectric layer on the insulating layer including the first upper metal layer; a second lower metal layer connected to the first upper metal layer through the upper interlayer dielectric layer and the first capping layer; a second capping layer aligned on the upper interlayer dielectric layer including the second lower metal layer and formed with a hole for partially exposing the second lower metal layer; a pad aligned on the second capping layer and connected to the second lower metal layer; a protective layer on the second capping layer; and a second upper metal layer aligned on the second capping layer.

Figure 1:
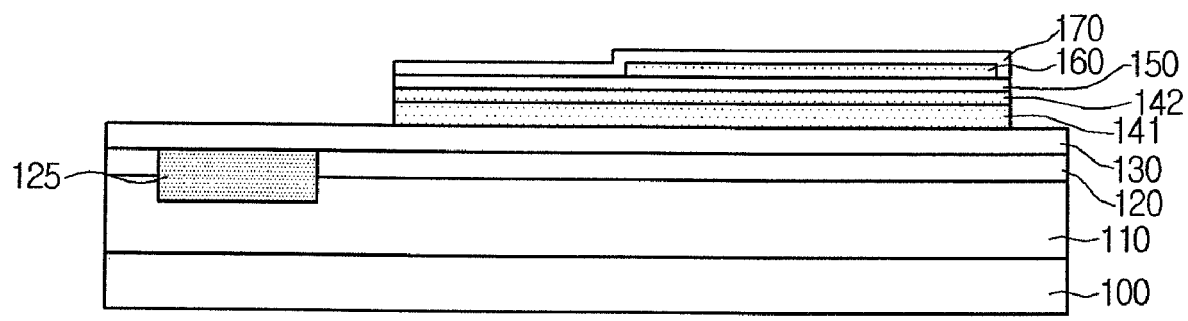

20 Claims, 5 Drawing Sheets

CAPACITOR OF SEMICONDUCTOR DEVICE AND METHOD FOR MANUFACTURING THE SAME

The present application claims the benefit under 35 U.S.C. §119 of Korean Patent Application No. 10-2007-0131943, filed Dec. 17, 2007, which is hereby incorporated by reference in its entirety.

BACKGROUND

A related semiconductor device including an analog capacitor integrated with a logic circuit through high integration technology has been developed. A related PIP (Polysilicon Insulator Polysilicon) capacitor or a related MIM (Metal-Insulator-Metal) capacitor are types of capacitor structures used as an analog capacitor in CMOS (Complementary Metal Oxide Silicon) logic.

SUMMARY

Embodiments relate to a capacitor of a semiconductor device and a method for manufacturing the same, capable of maximizing operational characteristics of the semiconductor device by increasing the capacity of an MIM capacitor. According to embodiments, a capacitor of a semiconductor device includes: a first capacitor lower metal layer and a first capacitor insulating layer on a lower interlayer dielectric layer of a semiconductor substrate; a first capacitor upper metal layer aligned on the first capacitor insulating layer to partially expose the first capacitor insulating layer; a first capping layer and an upper interlayer dielectric layer on the first capacitor insulating layer including the first capacitor upper metal layer; a second capacitor lower metal layer connected to the first capacitor upper metal layer through the upper interlayer dielectric layer and the first capping layer; a second capping layer aligned on the upper interlayer dielectric layer including the second capacitor lower metal layer and formed with an open hole for partially exposing the second capacitor lower metal layer; a pad aligned on the second capping layer including the open hole and connected to the second capacitor lower metal layer; a protective layer on the second capping layer including the pad; and a second capacitor upper metal layer aligned on the second capping layer through the protective layer in correspondence with the second capacitor lower metal layer.

According to embodiments, a method for manufacturing the capacitor includes: forming a first capacitor lower metal layer and a first capacitor insulating layer on a lower interlayer dielectric layer of a semiconductor substrate; forming a first capacitor upper metal layer aligned on the first capacitor insulating layer to partially expose the first capacitor insulating layer; forming a first capping layer and an upper interlayer dielectric layer on the first capacitor insulating layer including the first capacitor upper metal layer; forming a second capacitor lower metal layer connected to the first capacitor upper metal layer through the upper interlayer dielectric layer and the first capping layer; forming a second capping layer having an open hole on the upper interlayer dielectric layer including the second capacitor lower metal layer to partially expose the second capacitor lower metal layer; forming a pad on the second capping layer including the open hole such that the pad is connected to the second capacitor lower metal layer; forming a protective layer on the second capping layer including the pad; and forming a second capacitor upper metal layer on the second capping layer through the protective layer in correspondence with the second capacitor lower metal layer.

DRAWINGS

Example FIGS. 1 to 10 are sectional views showing a manufacturing process for a capacitor of a semiconductor device according to embodiments.

DESCRIPTION

In the description below, it will be understood that when a layer (or film) is referred to as being 'on' another layer or substrate, it can be directly on another layer or substrate, or intervening layers may also be present. Further, it will be understood that when a layer is referred to as being 'under' another layer, it can be directly under another layer, or one or more intervening layers may also be present. In addition, it will also be understood that when a layer is referred to as being 'between' two layers, it can be the only layer between the two layers, or one or more intervening layers may also be present.

Referring to example FIG. 1, a first interlayer dielectric layer 110 and a second interlayer dielectric layer 120 may be formed on a semiconductor substrate 100. In addition, a trench may be formed by selectively etching the first and second interlayer dielectric layers 110 and 120. A lower interconnection 125 may be formed in the trench. The first interlayer dielectric layer 110 may include, for example, FSG (fluorinated silicate glass), and the second interlayer dielectric layer 120 may, for example, include a nitride layer.

As shown in example FIG. 1, a third interlayer dielectric layer 130, first capacitor lower metal layers 141 and 142, a first capacitor insulating layer 150, and a first capacitor upper metal layer 160 may then be formed on the second interlayer dielectric layer 120 including the region of the lower interconnection 125. The first capacitor lower metal layers 141 and 142 may include, for example, a Ti layer, a TiN layer, or a stack of the Ti layer and the TiN layer. In addition, the first capacitor insulating layer 150 may include, for example, a nitride layer, and the first capacitor upper metal layer 160 may, for example, include a TiN layer. The first capacitor upper metal layer 160 may be etched so as to selectively expose at least a portion of the first capacitor insulating layer 150.

After that, a first capping layer 170 may be formed over the surface of the semiconductor substrate 100. The first capping layer 170 may be formed over substantially the entire surface of the substrate, including the first capacitor upper metal layer 160. As for material, the first capping layer 170 may, for example, include a nitride layer. The first capping layer 170 can be formed on the first capacitor insulating layer 150 including the first capacitor upper metal layer 160. The first capacitor lower metal layers 141 and 142, the first capacitor insulating layer 150, and the first capping layer 170 may be etched such that the third interlayer dielectric layer 130 near the lower interconnection 125 can be exposed.

As a result, as shown in example FIG. 1, the first capacitor lower metal layers 141 and 142, the first capacitor insulating layer 150, the first capacitor upper metal layer 160 and the first capping layer 170 are patterned on the third interlayer dielectric layer 130 at a location opposite the lower interconnection 125. Thus, the first capacitor lower metal layers 141 and 142, the first capacitor insulating layer 150, and the first capacitor upper metal layer 160 constitute a MIM structure, thereby forming a first capacitor.

Figure 2:
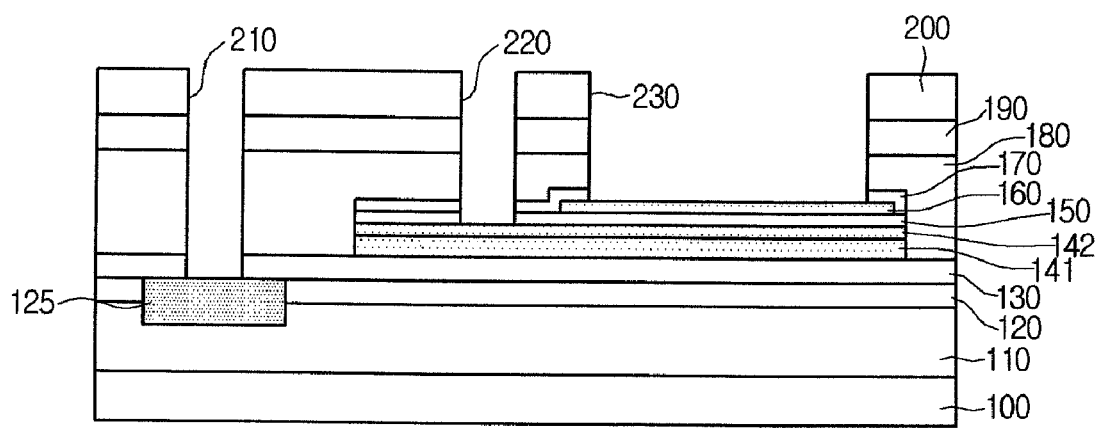

As shown in example FIG. 2, a fourth interlayer dielectric layer 180 may be over the semiconductor substrate 100. The fourth interlayer dielectric layer 180 may be formed over substantially the entire surface of the semiconductor substrate 100 including at least a portion of the first capping layer 170. In addition, in order to compensate for step difference of the third interlayer dielectric layer 130 including the first capping layer 170, a surface of the fourth interlayer dielectric layer 180 may be planarized such as, for example, by performing a CMP (chemical mechanical polishing) process. Then, a fifth interlayer dielectric layer 190 and a sixth interlayer dielectric layer 200 may be deposited on the fourth interlayer dielectric layer 180. For example, the fourth and sixth interlayer dielectric layers 180 and 200 may include an oxide layer, and the fourth interlayer dielectric layer 180 may include a nitride layer.

First via hole 210, second via hole 220, and third via hole 230 may be formed to expose the lower interconnection 125, the first capacitor lower metal layers 141 and 142, and the first capacitor upper metal layer 160, respectively. The first via hole 210 may be formed through the sixth, fifth, fourth and third interlayer dielectric layers 200, 190, 180, and 130 to expose the lower interconnection 125. The second via hole 220 may be formed through the sixth, fifth, and fourth interlayer dielectric layers 200, 190, and 180, the first capping layer 170 and the first capacitor insulating layer 150 to expose the first capacitor lower metal layer 142. While the third via hole 230 may be formed through the sixth, fifth and fourth interlayer dielectric layers 200, 190, and 180, and the first capping layer 170 to expose the first capacitor upper metal layer 160. The third via hole 230 may, for example, have a width larger than a width of the first via hole 210 or the second via hole 220. That is, the third via hole 230 may have a large width to expose substantially the entire surface of the first capacitor upper metal layer 160 except for its periphery.

Figure 3:
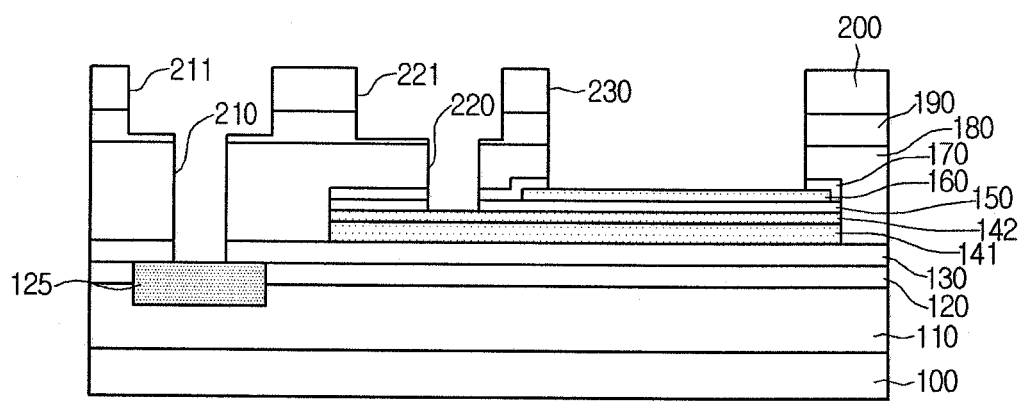

Referring to example FIG. 3, first and second trenches 211 and 221 may formed in the first and second via holes 210 and 220, respectively. The first and second trenches 211 and 221 can be formed, for example, through a damascene process. Accordingly, the first and second trenches 211 and 221 can be formed through a dry etching process or a wet etching process by using a metal mask pattern. As a result, a first via trench is formed over the bottom interconnection 125, and a second via trench is formed over the first capacitor lower metal layers 141 and 142. Because the fifth interlayer dielectric layer 190 may be chosen to have an etching selectivity relative to the sixth interlayer dielectric layer 200, a dual damascene structure may be formed. In addition, when the third via hole 230 is designed to have a size nearly equal to a size of the metal mask, a boundary between etched portions may not appear when a second capacitor lower metal layer is formed.

Figure 4:
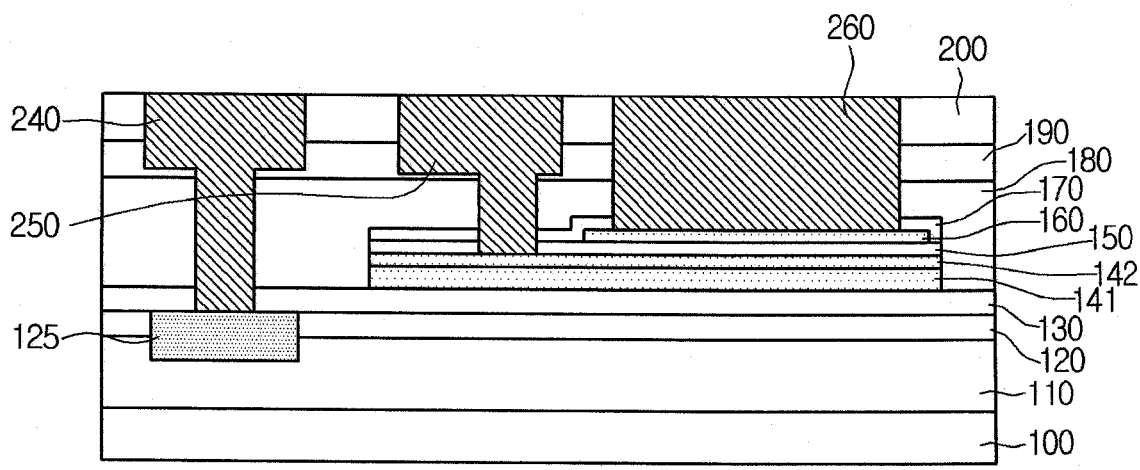

As shown in example FIG. 4, a second capacitor lower metal layer 260 may formed in the third via hole 230. The second capacitor lower metal layer 260 can be formed, for example, by depositing metal (e.g., copper) over the sixth interlayer dielectric layer 200 and then planarizing the metal through the CMP process. Although not shown in the drawings, a barrier metal layer and a seed metal layer can be formed before the metal is deposited. Because the metal may be deposited over portions of the sixth interlayer dielectric layer 200 that include the first and second via trenches and the third via hole 230, a first upper interconnection 240 connected to the lower interconnection 125 may formed in the first via trench, a second upper interconnection 250 connected to the first capacitor lower metal layers 141 and 142 may be formed in the second via trench; and, further, the second capacitor lower metal layer 260 may be formed in the third via hole 230.

Figure 5:
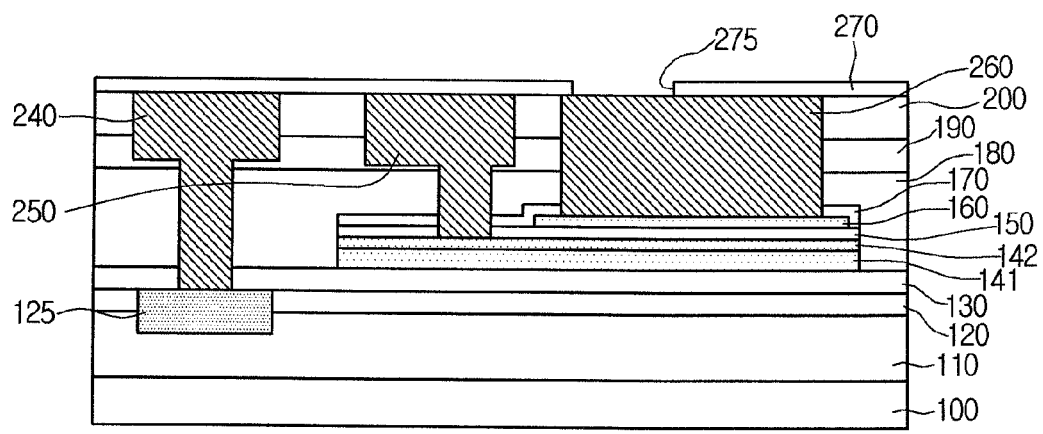

Referring to example FIG. 5, a second capping layer 270 may formed on the sixth interlayer dielectric layer 200 to protect the second capacitor lower metal layer 260. The second capping layer 270 may include, for example, a nitride layer. The second capping layer 270 may serve as a second capacitor insulating layer. The second capping layer 270 may be selectively removed to form a hole 275 for exposing at least a portion of the second capacitor lower metal layer 260. The hole 275 can be formed, for example, through either a dry etching or a wet etching process by using a mask pattern that is formed through an exposure and development process.

Figure 6:
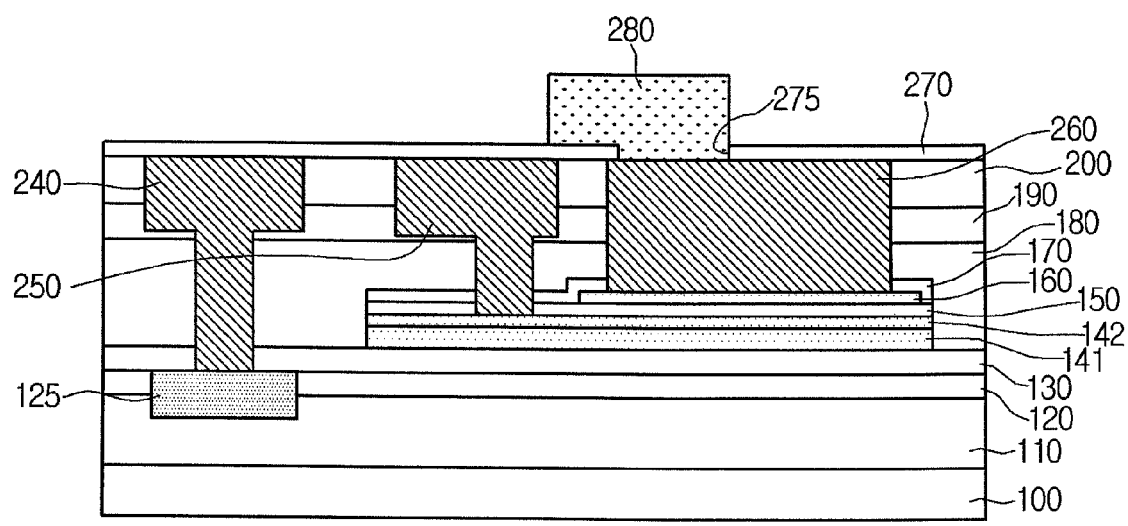
Figure 7:
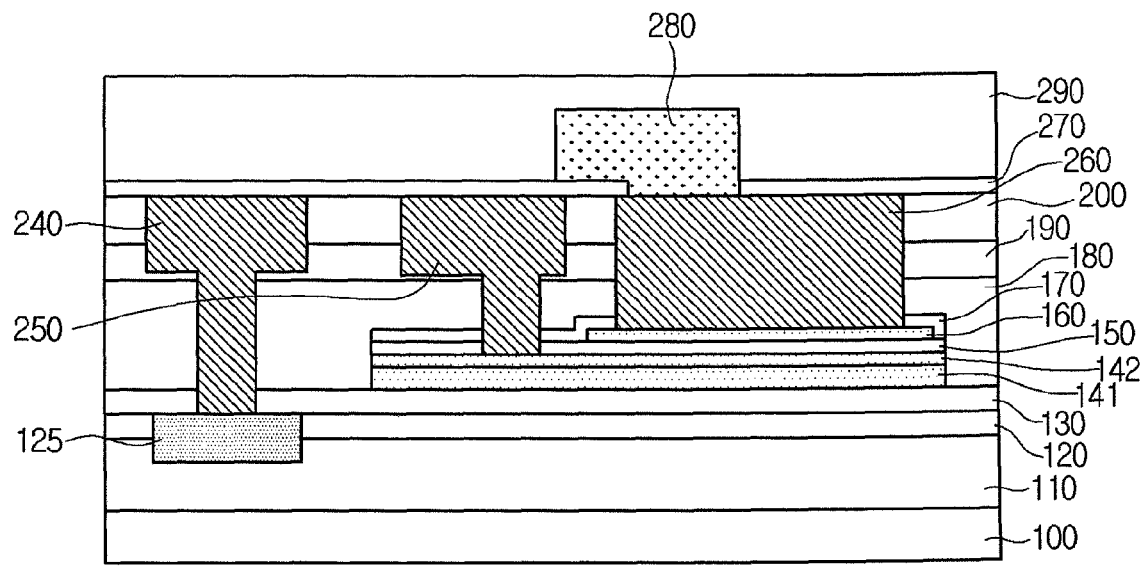

In example FIG. 6, a pad 280 may formed over the hole 275. The pad 280 may, for example, include aluminum. The pad 280 can be formed by depositing aluminum, or other conductive material, on at least a portion of the second capping layer 270 that includes the hole 275 and then patterning the aluminum such that the pad 280 can be connected to the second capacitor lower metal layer 260. As shown in example FIG. 7, a first protective layer 290 may be formed on the second capping layer 270; the first protective layer may be formed on the pad 280 as well. The first protective layer 290 may include, for example, a nitride layer and may completely, or substantially, cover the pad 280.

Figure 8:
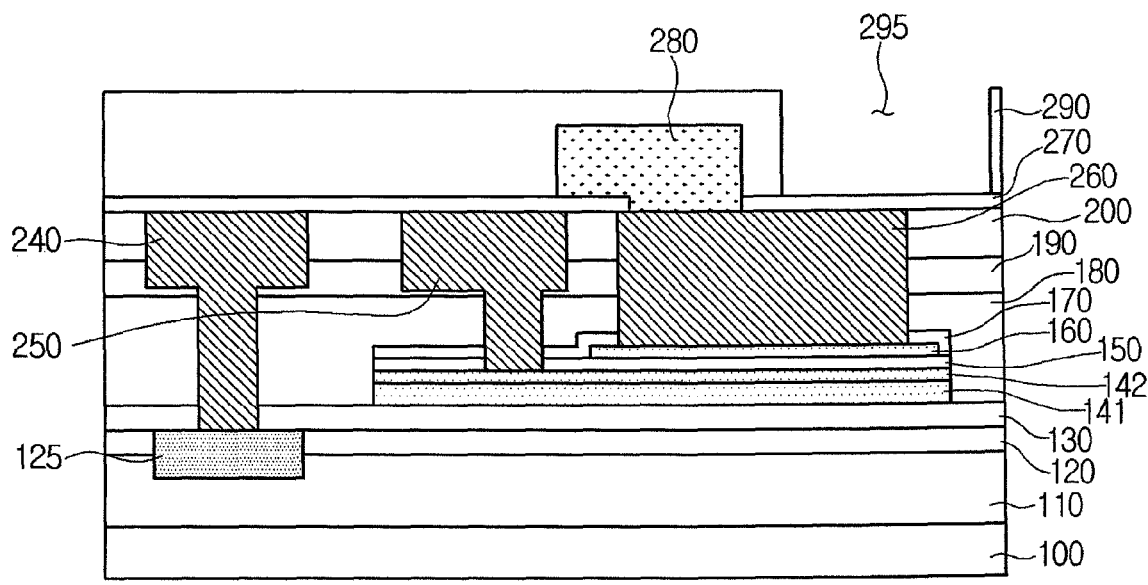
Figure 9:
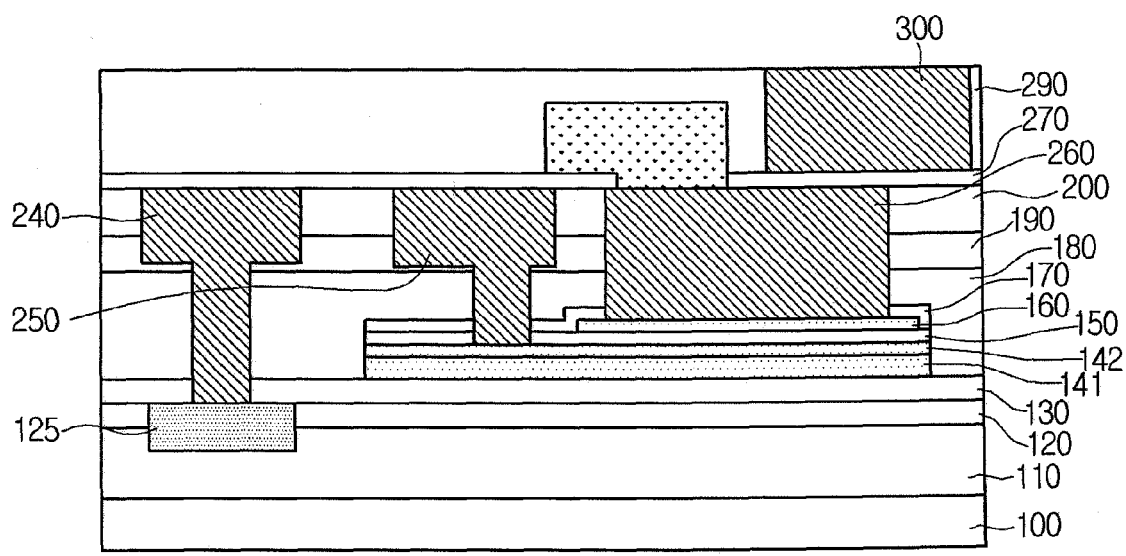

Referring to example FIG. 8, a third trench 295 may be formed in the first protective layer 290 to selectively expose the second capping layer 270. The third trench 295 may be formed in a region corresponding to the second capacitor lower metal layer 270 while being spaced apart from the pad 280. In example FIG. 9, a second capacitor upper metal layer 300 may be formed in the third trench 295. The second capacitor upper metal layer 300 may, for example, be formed by depositing a metal such as copper, for example, in the trench 295 and then planarizing the metal through the CMP, or similar, process. Thus, the second capacitor lower metal layer 260, the second capping layer 270, and the second capacitor upper metal layer 300 constitute a MIM structure, thereby forming a second capacitor. Referring to example FIG. 10, a second protective layer 310 may be formed on the first protective layer 290 including the second capacitor upper metal layer 300. In addition, a pad hole 315 may be formed in the second protective layer 310 to expose the pad 280.

Figure 10:
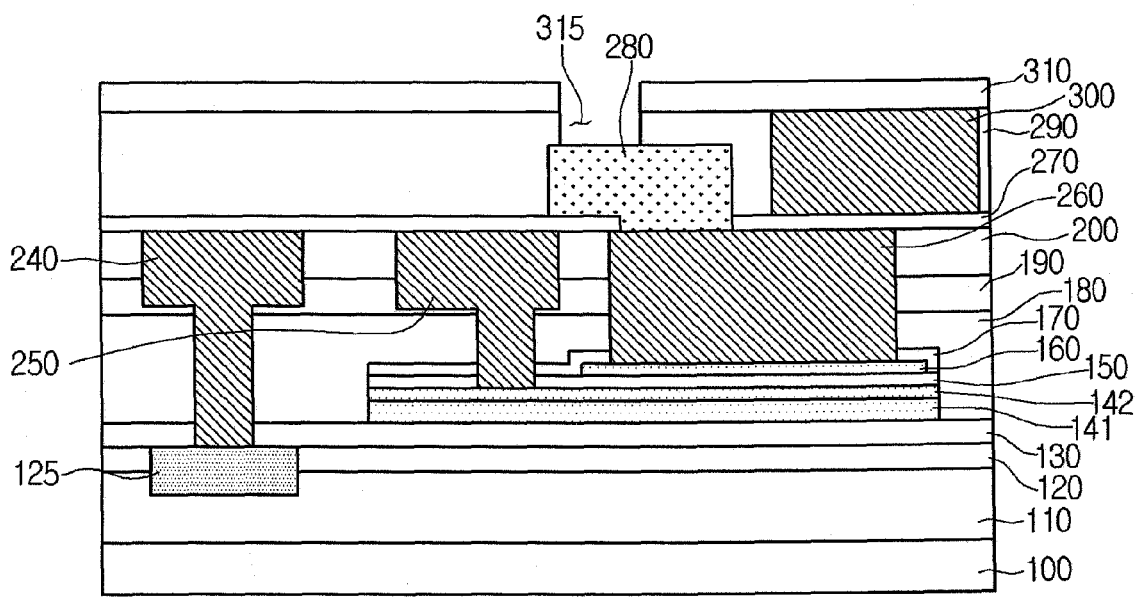

As shown in example FIG. 10, the capacitor of a semiconductor device according to embodiments includes first capacitor lower metal layers 141 and 142 formed on a lower interlayer dielectric layer of a semiconductor substrate 100, a first capacitor insulating layer 150, and a first capacitor upper metal layer 160 formed on the first capacitor insulating layer 150 to partially expose the first capacitor insulating layer 150. In addition, the capacitor includes a first capping layer 170 formed on the first capacitor insulating layer 150 and upper interlayer dielectric layer, and a second capacitor lower metal layer 260 connected to the first capacitor upper metal layer 160 through the upper interlayer dielectric layer and the first capping layer 170.

Further, the capacitor includes a second capping layer 270 aligned on the upper interlayer dielectric layer and formed with a hole 275 for partially exposing the second capacitor lower metal layer 260. In addition, the capacitor includes a pad 280 formed on the second capping layer 270 and connected to the second capacitor lower metal layer 260, a protective layer 290 formed on the second capping layer 270, and a second capacitor upper metal layer 300 formed on the second capping layer 270 in correspondence with the second capacitor lower metal layer 260 by passing through the protective layer 290.

The lower interlayer dielectric layer may include first, second and third interlayer dielectric layers 110, 120 and 130, and the upper interlayer dielectric layer may include fourth, fifth, and sixth interlayer dielectric layers 180, 190 and 200. The upper interconnection 250 may be connected to the first capacitor lower metal layers 141 and 142 through the upper interlayer dielectric layer and the first capping layer 170. The second capacitor lower metal layer 260 and the second capacitor upper metal layer 300 may include copper having low specific resistance, so that the operational characteristics of the capacitor can be maximized.

The first capacitor lower metal layers 141 and 142, the first capacitor insulating layer 150, and the first capacitor upper metal layer 160 constitute a first capacitor having a MIM structure. The second capacitor lower metal layer 260, the second capping layer 270, and the second capacitor upper metal layer 300 constitute a second capacitor having a MIM structure. Furthermore, the second capacitor may be disposed on the first capacitor in a parallel configuration, so that capacitance can be maximized. That is, the first capacitor includes the first capacitor lower metal layers 141 and 142, the first capacitor insulating layer 150, and the first capacitor upper metal layer 160, which are configured in the MIM structure, and the second capacitor includes the second capacitor lower metal layer 260, the second capping layer 270, and the second capacitor upper metal layer 300, which are configured in the MIM structure, so that capacitance of the capacitor can be increased. Further, the second capacitor is stacked on the first capacitor in parallel, so that the first and second capacitors have capacitance of C1+C2. Accordingly, capacitance of the capacitor can be increased in the same area without performing an additional mask process, so that the operational speed of the semiconductor device can be maximized.

It will be obvious and apparent to those skilled in the art that various modifications and variations can be made in the embodiments disclosed. Thus, it is intended that the disclosed embodiments cover the obvious and apparent the modifications and variations, provided that they are within the scope of the appended claims and their equivalents.

What is claimed is:

1. A capacitor of a semiconductor device, the capacitor comprising:
    a first capacitor lower metal layer and a first capacitor insulating layer over a lower interlayer dielectric layer of a semiconductor substrate;
    a first capacitor upper metal layer over the first capacitor insulating layer, the first capacitor upper metal layer aligned so as to at least partially expose the first capacitor insulating layer;
    a first capping layer and an upper interlayer dielectric layer over the first capacitor insulating layer and the first capacitor upper metal layer;
    a second capacitor lower metal layer electrically coupled with to the first capacitor upper metal layer through the upper interlayer dielectric layer and the first capping layer;
    a second capping layer over the upper interlayer dielectric layer and the second capacitor lower metal layer, the second capping layer including a hole aligned to at least partially expose the second capacitor lower metal layer;
    a pad aligned over the second capping layer and the hole, and electrically coupled with the second capacitor lower metal layer;
    a protective layer over the second capping layer and the pad; and
    a second capacitor upper metal layer over the second capping layer and extending through the protective layer, the second capacitor upper metal layer at least partially aligned with the second capacitor lower metal layer.

2. The capacitor of claim 1, wherein the second capacitor lower metal layer comprises copper.

3. The capacitor of claim 1, wherein the second capacitor upper metal layer comprises copper.

4. The capacitor of claim 1, wherein the first capacitor lower metal layer, the first capacitor insulating layer, and the first capacitor upper insulating layer constitute a first capacitor, the second capacitor lower metal layer, the second capping layer and the second capacitor upper metal layer constitute a second capacitor, and the second capacitor is aligned over the first capacitor.

5. The capacitor of claim 1, comprising:
    an upper interconnection electrically coupled with the first capacitor lower metal layer through the upper interlayer dielectric layer and the first capping layer.

6. The capacitor of claim 1, wherein the lower interlayer dielectric layer comprises a plurality of interlayer dielectric layers.

7. The capacitor of claim 1, wherein the upper interlayer dielectric layer comprises a plurality of interlayer dielectric layers.

8. The capacitor of claim 1, wherein the first capacitor lower metal layer comprises a plurality of metal layers.

9. The capacitor of claim 1, wherein the second capping layer comprises a nitride layer.

10. A method for manufacturing a capacitor of a semiconductor device, the method comprising:
    forming a first capacitor lower metal layer and a first capacitor insulating layer over a lower interlayer dielectric layer of a semiconductor substrate;
    forming a first capacitor upper metal layer over the first capacitor insulating layer, the first capacitor upper metal layer aligned so as to at least partially expose the first capacitor insulating layer;
    forming a first capping layer and an upper interlayer dielectric layer over the first capacitor insulating layer and the first capacitor upper metal layer;
    forming a second capacitor lower metal layer electrically coupled with the first capacitor upper metal layer through the upper interlayer dielectric layer and the first capping layer;
    forming a second capping layer over the upper interlayer dielectric layer and the second capacitor lower metal layer, the second capping layer including a hole aligned to at least partially expose the second capacitor lower metal layer;
    forming a pad aligned over the second capping layer and the hole, and electrically coupled with the second capacitor lower metal layer;
    forming a protective layer over the second capping layer and the pad; and
    forming a second capacitor upper metal layer over the second capping layer and extending through the protective layer, the second capacitor upper metal layer at least partially aligned with the second capacitor lower metal layer.

11. The method of claim 10, wherein forming the second capacitor lower metal layer includes:
    forming a via hole through the upper interlayer dielectric layer and the first capping layer such that at least a portion of the first capacitor upper metal layer is exposed through the via hole; and
    depositing a conductive material to fill the via hole.

12. The method of claim 11, comprising:
    performing a chemical mechanical polishing process on the conductive material.

13. The method of claim 11, wherein forming the via hole includes etching the upper interlayer dielectric layer and the first capping layer.

14. The method of claim 11, wherein the conductive material comprises copper.

15. The method of claim 10, wherein the second capping layer includes a nitride layer.

16. The method of claim 10, wherein forming the second capacitor upper metal layer includes:
forming a trench in the protective layer to expose at least a portion of the second capping layer over the second capacitor lower metal layer; and
depositing a conductive material to fill the trench with the conductive material.

17. The method of claim 16, wherein forming the trench includes etching the protective layer.

18. The method of claim 16, wherein the conductive material comprises copper.

19. The method of claim 16, comprising:
performing a chemical mechanical polishing process on the conductive material.

20. The method of claim 10, comprising:
forming an upper interconnection electrically coupled with the first capacitor lower metal layer when the second capacitor lower metal layer is formed.

* * * * *